United States Patent
Lin et al.

(10) Patent No.: US 10,418,240 B2
(45) Date of Patent: Sep. 17, 2019

(54) NITRIDE SEMICONDUCTOR STRUCTURE

(71) Applicant: ELITE ADVANCED LASER CORPORATION, New Taipei (TW)

(72) Inventors: Kun-Chuan Lin, Taipei (TW); Jin-Hsiang Liu, Taipei (TW); Yu-Lin Hsiao, New Taipei (TW)

(73) Assignee: ELITE ADVANCED LASER CORPORATION, New Taipei (TW)

( * ) Notice: Subject to any disclaimer, the term of this patent is extended or adjusted under 35 U.S.C. 154(b) by 0 days.

(21) Appl. No.: 15/869,057

(22) Filed: Jan. 12, 2018

(65) Prior Publication Data
US 2019/0157080 A1    May 23, 2019

(30) Foreign Application Priority Data

Nov. 22, 2017    (TW) .............................. 106140432 A

(51) Int. Cl.
*H01L 31/0304*    (2006.01)
*H01L 31/0312*    (2006.01)
(Continued)

(52) U.S. Cl.
CPC .... *H01L 21/02507* (2013.01); *H01L 21/0254* (2013.01); *H01L 21/0262* (2013.01);
(Continued)

(58) Field of Classification Search
CPC ....... H01L 31/03046; H01L 31/035281; H01L 31/0312; H01L 21/0251; H01L 21/02447; H01L 21/02458; H01L 21/02507; H01L 21/0254; H01L 21/02381; H01L 21/0242; H01L 21/02488; H01L 21/02505
See application file for complete search history.

(56) References Cited

U.S. PATENT DOCUMENTS 6,649,287 B2    11/2003    Weeks, Jr. et al.
7,910,937 B2    3/2011    Chen et al.
(Continued)

FOREIGN PATENT DOCUMENTS

CN    103515419    1/2014
TW    201344804    11/2013
(Continued)

OTHER PUBLICATIONS

"Office Action of Taiwan Counterpart Application", dated Mar. 31, 2018, p. 1-p. 5, in which the listed references were cited.

*Primary Examiner* — Brian Turner
(74) *Attorney, Agent, or Firm* — JCIPRNET

(57) ABSTRACT

A nitride semiconductor structure includes a substrate, a nitride semiconductor layer, and a buffer stack layer between the substrate and the nitride semiconductor layer. The buffer stack layer includes a plurality of metal nitride multilayers repeatedly stacked, wherein each of the metal nitride multilayers consists of a first, a second, and a third metal nitride thin films in sequence, or consists of the first, the third, the second, and the third metal nitride thin films in sequence. The aluminum concentration of the first metal nitride thin film is higher than that of the third metal nitride thin film, and the aluminum concentration of the third metal nitride thin film is higher than that of the second metal nitride thin film.

16 Claims, 1 Drawing Sheet

(51) Int. Cl.
*H01L 31/0352* (2006.01)
*H01L 29/205* (2006.01)
*H01L 29/778* (2006.01)
*H01L 29/15* (2006.01)
*H01L 21/02* (2006.01)
*H01L 29/20* (2006.01)

(52) U.S. Cl.
CPC .. *H01L 21/02381* (2013.01); *H01L 21/02458* (2013.01); *H01L 29/155* (2013.01); *H01L 29/205* (2013.01); *H01L 29/2003* (2013.01)

(56) References Cited

U.S. PATENT DOCUMENTS

| | | |
|---|---|---|
| 8,232,557 B2 | 7/2012 | Makabe et al. |
| 8,247,796 B2 | 8/2012 | Makabe et al. |
| 8,344,356 B2 | 1/2013 | Sakamoto et al. |
| 9,112,077 B1 | 8/2015 | Liao et al. |
| 2008/0296625 A1 | 12/2008 | Li et al. |
| 2012/0119219 A1 | 5/2012 | Takado et al. |
| 2012/0181577 A1* | 7/2012 | Matsuo ............... H01L 29/7787 257/190 |
| 2013/0270575 A1* | 10/2013 | Humphreys ...... H01L 21/02381 257/76 |
| 2016/0020346 A1* | 1/2016 | Hsuan ............... H01L 31/03046 257/77 |

FOREIGN PATENT DOCUMENTS

| | | |
|---|---|---|
| TW | 201523704 | 6/2015 |
| TW | 201605077 | 2/2016 |
| TW | I602248 | 10/2017 |

\* cited by examiner

NITRIDE SEMICONDUCTOR STRUCTURE

CROSS-REFERENCE TO RELATED APPLICATION

This application claims the priority benefit of Taiwan application serial no. 106140432, filed on Nov. 22, 2017. The entirety of the above-mentioned patent application is hereby incorporated by reference herein and made a part of this specification.

BACKGROUND OF THE INVENTION

Field of the Invention

The invention relates to a semiconductor structure, and more particularly, to a nitride semiconductor structure.

Description of Related Art

Due to high heat resistance, high breakdown voltage, high electron saturation velocity and high current density, a semiconductor device formed of a gallium nitride-based compound can be operated under high frequency and can provide higher power, and therefore has considerable potential in, vehicle electronics, power management systems, lighting, industrial equipment, portable products, communication devices, consumer electronics and so on.

At present, the substrate used to grow a nitrogen-containing semiconductor is, for example, a sapphire substrate. Since the lattice constant of the sapphire substrate cannot match the lattice of gallium nitride, defects or cracks are likely to occur during the growth of the nitrogen-containing semiconductor. As a result, a good nitrogen-containing semiconductor cannot be formed. Moreover, although the lattice constant of the existing special substrate can match the lattice constant of gallium nitride, the price of the special substrate is so high that the overall process of the nitrogen-containing semiconductor device becomes too costly. Therefore, how to grow a good nitrogen-containing semiconductor device on a commonly used substrate is still an important issue to be solved.

SUMMARY OF THE INVENTION

The invention provides a nitride semiconductor structure having good lattice quality.

A nitride semiconductor structure of the invention includes a substrate, a nitride semiconductor layer, and a buffer stack layer located between the substrate and the nitride semiconductor layer. The buffer stack layer includes a plurality of metal nitride multilayers that are repeatedly stacked, wherein each of the metal nitride multilayers consists of a first, a second, and a third metal nitride thin films in sequence. An aluminum concentration of the first metal nitride thin film is higher than an aluminum concentration of the third metal nitride thin film, and the aluminum concentration of the third metal nitride thin film is higher than an aluminum concentration of the second metal nitride thin film.

Another nitride semiconductor structure of the invention includes a substrate, a nitride semiconductor layer, and a buffer stack layer located between the substrate and the nitride semiconductor layer. The buffer stack layer includes a plurality of metal nitride multilayers that are repeatedly stacked, wherein each of the metal nitride multilayers consists of a first, a third, a second, and the third metal nitride thin films in sequence. An aluminum concentration of the first metal nitride thin film is higher than an aluminum concentration of the third metal nitride thin film, and the aluminum concentration of the third metal nitride thin film is higher than an aluminum concentration of the second metal nitride thin film.

In one or more embodiments of the invention, the second metal nitride thin film includes aluminum gallium nitride, gallium nitride, aluminum indium nitride or aluminum indium gallium nitride, the first metal nitride thin film includes aluminum nitride, aluminum indium nitride, aluminum gallium nitride or aluminum indium gallium nitride, and the third metal nitride thin film includes aluminum gallium nitride, aluminum indium nitride or aluminum indium gallium nitride.

In one or more embodiments of the invention, a thickness of the first metal nitride thin film is 1000 nm or less, a thickness of the second metal nitride thin film is 1000 nm or less, and a thickness of the third metal nitride thin film is 1000 nm or less.

In one or more embodiments of the invention, the first metal nitride thin film, the second metal nitride thin film and the third metal nitride thin film each have a uniform aluminum concentration.

In one or more embodiments of the invention, the first metal nitride thin film, the second metal nitride thin film and the third metal nitride thin film respectively have different aluminum concentrations.

In one or more embodiments of the invention, the aluminum concentration of each of the first metal nitride thin film, the second metal nitride thin film and the third metal nitride thin film varies in a linear, exponential, or curved manner.

In one or more embodiments of the invention, the buffer stack layer includes 2 to 200 layers of the metal nitride multilayer.

In one or more embodiments of the invention, a material of the substrate includes silicon.

In one or more embodiments of the invention, the nitride semiconductor structure further includes an epitaxial layer located between the substrate and the buffer stack layer.

In one or more embodiments of the invention, the epitaxial layer includes an aluminum nitride layer or a stack layer of aluminum nitride and aluminum gallium nitride.

Based on the above, in the invention, the buffer stack layer is disposed between the substrate and the nitride semiconductor layer, the buffer stack layer includes a plurality of metal nitride multilayers that are repeatedly stacked, and these metal nitride multilayers all include a plurality of metal nitride thin films that exhibit specific variation in the aluminum concentration. Therefore, lattice mismatch between the substrate and the nitride semiconductor layer can be considerably reduced.

To make the above features and advantages of the invention more comprehensible, several embodiments accompanied with drawings are described in detail as follows.

DETAILED DESCRIPTION OF DISCLOSED EMBODIMENTS

A nitride semiconductor structure of an embodiment of the invention is, for example, a semiconductor power device or a light-emitting device. However, the invention is not limited to the above applications.

Figure 1:
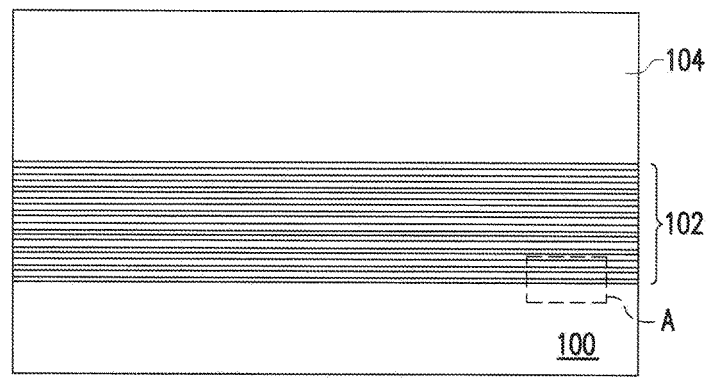
FIG. 1 is a schematic view of a nitride semiconductor structure according to an embodiment of the invention.

FIG. 1 is a schematic view of a nitride semiconductor structure according to an embodiment of the invention.

Referring to FIG. 1, a nitride semiconductor structure of the present embodiment includes a substrate 100, a buffer stack layer 102 and a nitride semiconductor layer 104. The buffer stack layer 102 is located between the substrate 100 and the nitride semiconductor layer 104, and is configured to alleviate a problem of lattice mismatch between the substrate 100 and the nitride semiconductor layer 104. The nitride semiconductor layer 104 is, for example, formed of a plurality of semiconductor layers including a first-type doped semiconductor layer, a second-type doped semiconductor layer, an active layer and so on. A material of the nitride semiconductor layer 104 is, for example, formed of gallium nitride (GaN) and aluminum gallium nitride (AlGaN). The substrate 100 is, for example, a silicon substrate containing silicon, and the substrate 100 provides a (111) crystal plane for growth of the buffer stack layer 102. The buffer stack layer 102 includes a plurality of metal nitride multilayers that are repeatedly stacked, and the buffer stack layer 102 is connected to the substrate 100 and the nitride semiconductor layer 104.

Figure 2:
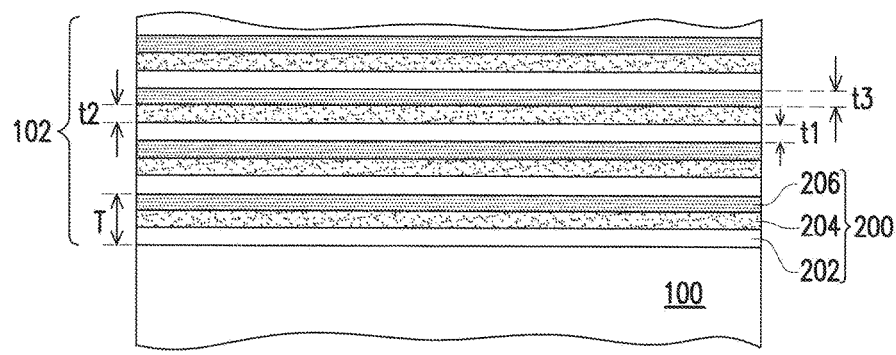
FIG. 2 is a schematic partial enlarged view of region A in FIG. 1.

FIG. 2 is a schematic partial enlarged view of region A in FIG. 1. FIG. 2 shows metal nitride multilayers 200 in the buffer stack layer 102. Each of the metal nitride multilayers 200 consists of a first metal nitride thin film 202, a second metal nitride thin film 204 and a third metal nitride thin film 206 in sequence. That is, in each of the metal nitride multilayers 200, the first metal nitride thin film 202 is closer to the substrate 100 as compared with the second metal nitride thin film 204 and the third metal nitride thin film 206, the third metal nitride thin film 206 is far away from the substrate 100, and the second metal nitride thin film 204 is located between the first metal nitride thin film 202 and the third metal nitride thin film 206. In the present embodiment, an aluminum concentration of the first metal nitride thin film 202 is higher than an aluminum concentration of the third metal nitride thin film 206, and the aluminum concentration of the third metal nitride thin film 206 is higher than an aluminum concentration of the second metal nitride thin film 204. The second metal nitride thin film 204 includes, for example, aluminum gallium nitride (AlGaN), gallium nitride (GaN), aluminum indium nitride (AlInN), aluminum indium gallium nitride (AlInGaN) or the like. The first metal nitride thin film 202 includes, for example, aluminum nitride (AlN), aluminum indium nitride (AlInN), aluminum gallium nitride (AlGaN), aluminum indium gallium nitride (AlInGaN) or the like. The third metal nitride thin film 206 includes, for example, aluminum gallium nitride (AlGaN), aluminum indium nitride (AlInN), aluminum indium gallium nitride (AlInGaN) or the like.

As mentioned above, the nitride semiconductor structure of the present embodiment includes the buffer stack layer 102 disposed between the substrate 100 and the nitride semiconductor layer 104. The buffer stack layer 102 includes the plurality of metal nitride multilayers 200. The metal nitride multilayers 200 each include the three metal nitride thin films 202, 204 and 206, as shown in FIG. 2. The aluminum concentrations of the three metal nitride thin films 202, 204 and 206 are respectively high, low, and intermediate in sequence. Therefore, the lattice constant can be suitably adjusted for growth of the nitride semiconductor layer 104.

Specifically, in the present embodiment, the first metal nitride thin film 202, the second metal nitride thin film 204 and the third metal nitride thin film 206 each have a uniform aluminum concentration. However, the invention is not limited thereto. In other embodiments of the invention, the aluminum concentration of the first metal nitride thin film 202 may be distributed along a thickness direction in a linearly varying, exponentially varying, or curvedly varying manner; the aluminum concentration of the second metal nitride thin film 204 may be distributed along a thickness direction in a linearly varying, exponentially varying, or curvedly varying manner; and the aluminum concentration of the third metal nitride thin film 206 may be distributed along a thickness direction in a linearly varying, exponentially varying, or curvedly varying manner.

Referring again to FIG. 2, in the present embodiment, a thickness t1 of the first metal nitride thin film 202, a thickness t2 of the second metal nitride thin film 204 and a thickness t3 of the third metal nitride thin film 206 are all 1000 nm or less. Thus, a thickness T of a single metal nitride multilayer 200 does not exceed 3000 nm. The number of the metal nitride multilayers 200 contained in the buffer stack layer 102 may be within a range of 2 to 100. However, the invention is not limited thereto. In addition, an epitaxial layer (not illustrated) may further be included between the substrate 100 and the buffer stack layer 102, and the epitaxial layer is, for example, an AlN layer or a stack layer of AlN and AlGaN.

The buffer stack layer 102 of the present embodiment is formed by, for example, a metal-organic chemical vapor deposition (MOCVD) method. Taking AlInGaN as an example, if the substrate 100 is a silicon substrate, the substrate 100 may be heated to 1100° C. or higher in an MOCVD reaction chamber to remove oxides on a surface of the substrate 100. Next, ammonia ($NH_3$) and trimethylaluminum (TMAl) are introduced to grow the epitaxial layer, and $NH_3$, $H_2$, $N_2$, trimethylgallium (TMGa), TMAl, and trimethylindium (TMIn) are then introduced to form the first metal nitride thin film 202, the second metal nitride thin film 204 and the third metal nitride thin film 206 (all being AlInGaN thin films) in sequence, wherein the temperature of the MOCVD reaction chamber is kept at 950° C. or higher. The thicknesses of the epitaxial layer, the first metal nitride thin film 202, the second metal nitride thin film 204 and the third metal nitride thin film 206 may be controlled by adjusting the duration of growth.

Furthermore, the variation in the aluminum concentration of the first metal nitride thin film 202, the second metal nitride thin film 204 and the third metal nitride thin film 206 may further be controlled by a ratio of the introduced gas, thereby forming the buffer stack layer 102 having a good buffering function. The metal nitride multilayer 200 of the present embodiment is completed by repeatedly performing the aforesaid method.

Figure 3:
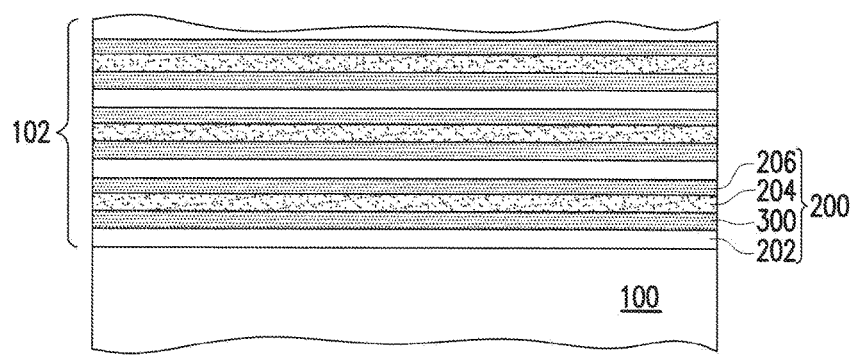
FIG. 3 is a schematic partial enlarged view of a nitride semiconductor structure according to another embodiment of the invention.

FIG. 3 is a schematic partial enlarged view of a nitride semiconductor structure according to another embodiment of the invention, wherein the same reference numerals as those in FIGS. 1 and 2 denote the same or similar elements, and repeated description of the same technical content is omitted.

Referring to FIG. 3, a nitride semiconductor structure of the present embodiment includes the substrate 100, a nitride semiconductor layer (not illustrated) and the buffer stack layer 102. The present embodiment differs from the previous embodiment in that, each of the metal nitride multilayers 200 in the buffer stack layer 102 consists of the first metal nitride thin film 202, a third metal nitride thin film 300, the second metal nitride thin film 204 and the third metal nitride thin film 206 in sequence. That is, the third metal nitride thin film 300 is disposed between the first metal nitride thin film 202 and the second metal nitride thin film 204, wherein the aluminum concentration of the first metal nitride thin film 202 is higher than the aluminum concentration of the third metal nitride thin films 206 and 300, and the aluminum concentration of both the third metal nitride thin films 206 and 300 is higher than the aluminum concentration of the second metal nitride thin film 204. The aforesaid third metal nitride thin films 206 and 300 may have the same or different aluminum concentrations, but the aluminum concentration of both the third metal nitride thin films 206 and 300 is lower than the aluminum concentration of the first metal nitride thin film 202 and higher than the aluminum concentration of the second metal nitride thin film 204. The other technical content may be understood with reference to the previous embodiment and will not be repeated.

In summary, the nitride semiconductor structure of an embodiment of the invention is disposed between the substrate and the nitride semiconductor layer. The buffer stack layer includes a plurality of metal nitride multilayers each including three or more metal nitride thin films, and the aluminum concentrations of the metal nitride thin films are respectively high, low, and intermediate, in sequence, or high, intermediate, low, and intermediate, in sequence. Therefore, lattice mismatch between the substrate and the nitride semiconductor layer can be considerably reduced.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A nitride semiconductor structure, comprising:
    a substrate;
    a nitride semiconductor layer located on the substrate; and
    a buffer stack layer located between the substrate and the nitride semiconductor layer, the buffer stack layer comprising 2 to 200 layers of metal nitride multilayers, each of the metal nitride multilayers consists of a first metal nitride thin film, a second metal nitride thin film and a third metal nitride thin film such that the first metal nitride thin film, the second metal nitride thin film and the third metal nitride thin film are alternately stacked, wherein the third metal nitride thin film in the buffer stack is closest to the nitride semiconductor layer, and an aluminum concentration of the first metal nitride thin film is higher than an aluminum concentration of the third metal nitride thin film, and the aluminum concentration of the third metal nitride thin film is higher than an aluminum concentration of the second metal nitride thin film.

2. The nitride semiconductor structure according to claim 1, wherein the second metal nitride thin film comprises aluminum gallium nitride, gallium nitride, aluminum indium nitride or aluminum indium gallium nitride, the first metal nitride thin film comprises aluminum nitride, aluminum indium nitride, aluminum gallium nitride or aluminum indium gallium nitride, and the third metal nitride thin film comprises aluminum gallium nitride, aluminum indium nitride or aluminum indium gallium nitride.

3. The nitride semiconductor structure according to claim 1, wherein a thickness of the first metal nitride thin film is 1000 nm or less, a thickness of the second metal nitride thin film is 1000 nm or less, and a thickness of the third metal nitride thin film is 1000 nm or less.

4. The nitride semiconductor structure according to claim 1, wherein the first metal nitride thin film, the second metal nitride thin film and the third metal nitride thin film each have a uniform aluminum concentration.

5. The nitride semiconductor structure according to claim 1, wherein the first metal nitride thin film, the second metal nitride thin film and the third metal nitride thin film respectively have different aluminum concentrations.

6. The nitride semiconductor structure according to claim 1, wherein a material of the substrate comprises silicon.

7. The nitride semiconductor structure according to claim 1, further comprising an epitaxial layer located between the substrate and the buffer stack layer.

8. The nitride semiconductor structure according to claim 7, wherein the epitaxial layer comprises an aluminum nitride layer or a stack layer of aluminum nitride and aluminum gallium nitride.

9. A nitride semiconductor structure, comprising:
    a substrate;
    a nitride semiconductor layer located on the substrate; and
    a buffer stack layer located between the substrate and the nitride semiconductor layer, the buffer stack layer comprising a plurality of metal nitride multilayers that are repeatedly stacked, wherein the buffer stack layer comprises 2 to 200 layers of the metal nitride multilayer, each of the metal nitride multilayers consists of a first metal nitride thin film, a third metal nitride thin film, a second metal nitride thin film and the third metal nitride thin film in sequence, and an aluminum concentration of the first metal nitride thin film is higher than an aluminum concentration of the third metal nitride thin film, and the aluminum concentration of the third metal nitride thin film is higher than an aluminum concentration of the second metal nitride thin film.

10. The nitride semiconductor structure according to claim 9, wherein the second metal nitride thin film comprises aluminum gallium nitride, gallium nitride, aluminum indium nitride or aluminum indium gallium nitride, the first metal nitride thin film comprises aluminum nitride, aluminum indium nitride, aluminum gallium nitride or aluminum indium gallium nitride, and the third metal nitride thin film comprises aluminum gallium nitride, aluminum indium nitride or aluminum indium gallium nitride.

11. The nitride semiconductor structure according to claim 9, wherein a thickness of the first metal nitride thin film is 1000 nm or less, a thickness of the second metal nitride thin film is 1000 nm or less, and a thickness of the third metal nitride thin film is 1000 nm or less.

12. The nitride semiconductor structure according to claim 9, wherein the first metal nitride thin film, the second metal nitride thin film and the third metal nitride thin film each have a uniform aluminum concentration.

13. The nitride semiconductor structure according to claim 9, wherein the first metal nitride thin film, the second metal nitride thin film and the third metal nitride thin film respectively have different aluminum concentrations.

14. The nitride semiconductor structure according to claim 9, wherein a material of the substrate comprises silicon.

15. The nitride semiconductor structure according to claim 9, further comprising an epitaxial layer located between the substrate and the buffer stack layer.

16. The nitride semiconductor structure according to claim 15, wherein the epitaxial layer comprises an aluminum nitride layer or a stack layer of aluminum nitride and aluminum gallium nitride.

\* \* \* \* \*